(12) United States Patent
Hagiwara

(10) Patent No.: US 8,698,934 B2
(45) Date of Patent: Apr. 15, 2014

(54) SOLID-STATE IMAGE SENSING DEVICE, CAMERA MODULE, AND SOLID-STATE IMAGE SENSING DEVICE MANUFACTURING METHOD

(75) Inventor: Kenichiro Hagiwara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/427,260

(22) Filed: Mar. 22, 2012

(65) Prior Publication Data

US 2012/0242876 A1   Sep. 27, 2012

(30) Foreign Application Priority Data

Mar. 23, 2011   (JP) .................................. 2011-064930

(51) Int. Cl.
*H04N 5/335*   (2011.01)

(52) U.S. Cl.
USPC ............................ 348/308; 348/302; 348/294

(58) Field of Classification Search
USPC ........................ 348/294, 308, 302; 250/208.1
See application file for complete search history.

(56) References Cited

U.S. PATENT DOCUMENTS

| 2010/0059877 A1* | 3/2010 | Leib et al. ...................... 257/704 |
| 2010/0110271 A1* | 5/2010 | Yanagita et al. .............. 348/340 |
| 2011/0234830 A1* | 9/2011 | Kiyota et al. ............... 348/222.1 |

FOREIGN PATENT DOCUMENTS

JP   2008-210846   9/2008

* cited by examiner

*Primary Examiner* — Tuan Ho
*Assistant Examiner* — Zhenzhen Wu
(74) *Attorney, Agent, or Firm* — Oblon, Spivak, McClelland, Maier & Neustadt, L.L.P.

(57) ABSTRACT

According to one embodiment, a solid-state image sensing device includes a semiconductor substrate which includes a first surface and a second surface opposite to the first surface, a pixel which is provided in the semiconductor substrate and which photoelectrically converts light emitted via a lens on the second surface, a support substrate which is provided on a first insulating layer covering an element on the first surface and which includes a trench, and a first device which is provided on the first insulating layer and which is accommodated in the trench of the support substrate.

13 Claims, 13 Drawing Sheets

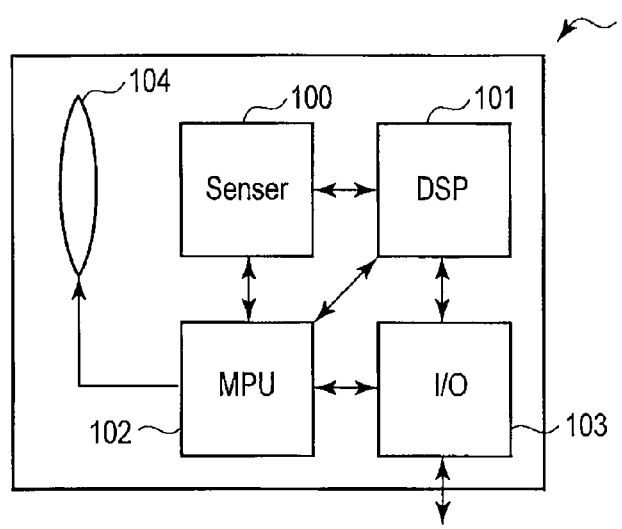
F I G. 1
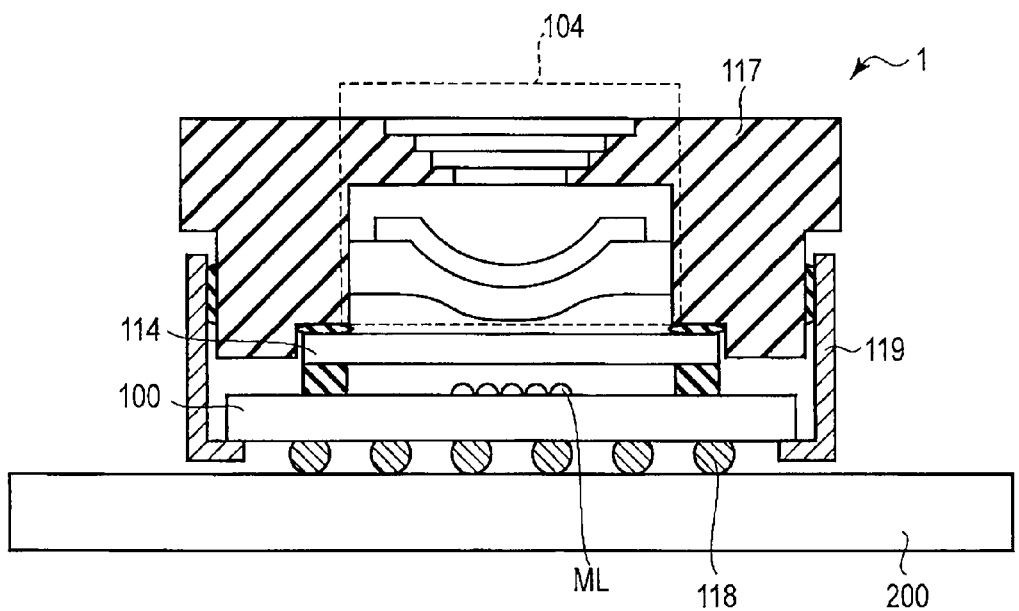
F I G. 2

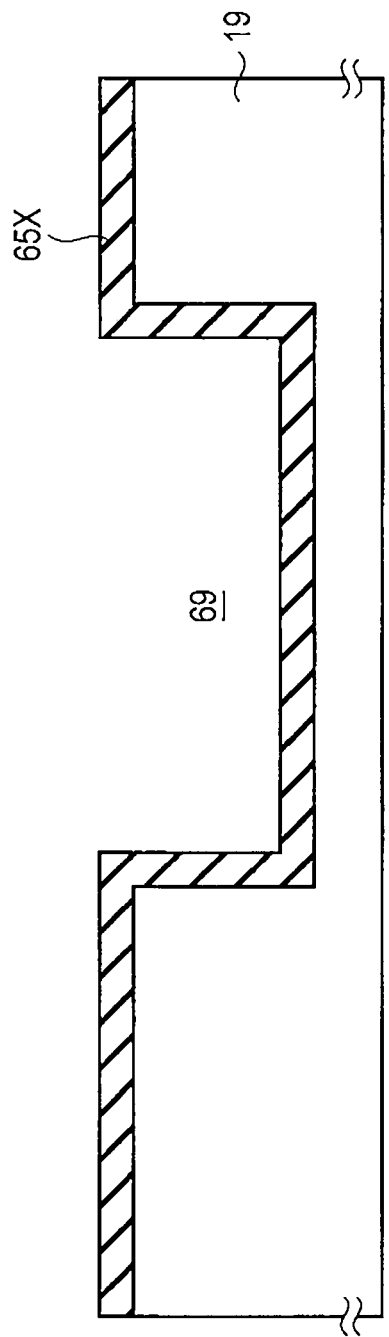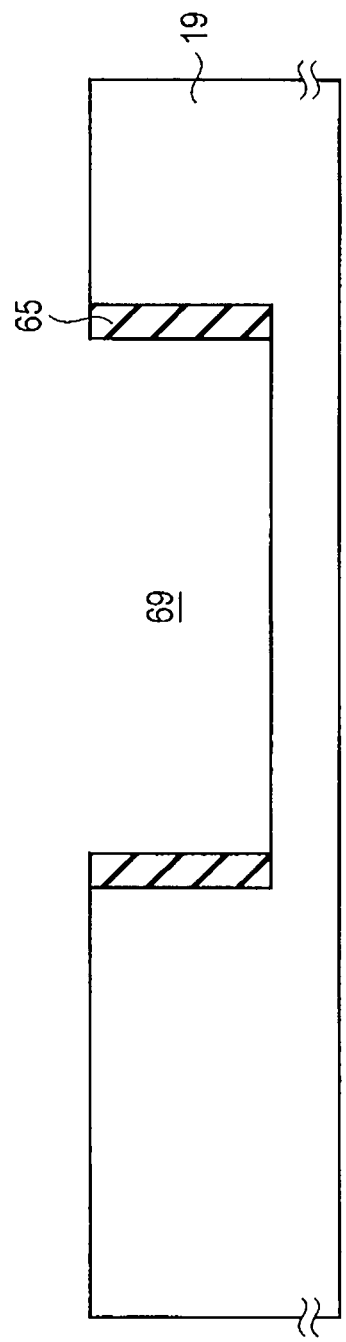

SOLID-STATE IMAGE SENSING DEVICE, CAMERA MODULE, AND SOLID-STATE IMAGE SENSING DEVICE MANUFACTURING METHOD

CROSS-REFERENCE TO RELATED APPLICATIONS

This application is based upon and claims the benefit of priority from prior Japanese Patent Application No. 2011-064930, filed Mar. 23, 2011, the entire contents of which are incorporated herein by reference.

FIELD

Embodiments described herein relate generally to a solid-state image sensing device, a camera module, and a solid-state image sensing device manufacturing method.

BACKGROUND

CCD image sensors and CMOS image sensors are used for various purposes in digital still cameras, video cameras, or surveillance cameras. For the size reduction of these cameras, the reduction in the area and thickness of camera modules including the image sensors is demanded.

In general, when an image sensor is configured in a module form, semiconductor chips such as a passive element including a chip condenser and a driver chip for the image sensor are mounted on a mounting substrate together with the image sensor as components separate from the image sensor to fulfill characteristics and performance that vary by user. Therefore, it is difficult to reduce the size of the camera module.

BRIEF DESCRIPTION OF THE DRAWINGS

FIG. 1 is a block diagram illustrating the internal configuration of a camera module;

FIG. 2 is a schematic sectional view showing the structure of the camera module;

FIG. 8A is a sectional view showing a step in the method of manufacturing the solid-state image sensing device according to the first embodiment;

FIG. 8B is a sectional view showing a step in the method of manufacturing the solid-state image sensing device according to the first embodiment;

DETAILED DESCRIPTION

[Embodiments]

Figure 3:
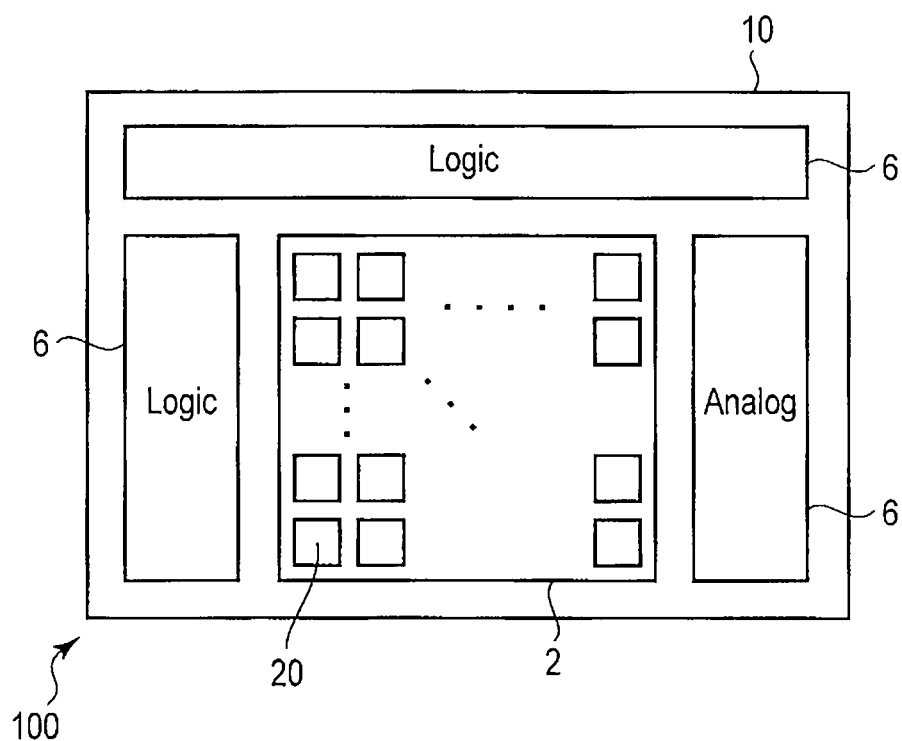
FIG. 3 is a plan view showing an example of the layout of an image sensor.

Hereinafter, embodiments will be described in detail with reference to the drawings. Elements having the same functions and configurations are provided with the same reference signs in the following explanation, and are repeatedly explained when necessary.

In general, according to one embodiment, a solid-state image sensing device includes a semiconductor substrate which includes a first surface and a second surface opposite to the first surface; a pixel which is provided in the semiconductor substrate and which photoelectrically converts light emitted via a lens on the second surface; a support substrate which is provided on a first insulating layer covering an element on the first surface and which includes a trench; and a first device which is provided on the first insulating layer and which is accommodated in the trench of the support substrate.

(1) First Embodiment

A solid-state image sensing device and a manufacturing method of the same according to the first embodiment are described with reference to FIG. 1 to FIG. 9.

(a) Configuration

The configuration of the solid-state image sensing device according to the first embodiment is described with reference to FIG. 1 to FIG. 4.

The overall configuration of a module including the solid-state image sensing device according to the present embodiment is described with reference to FIG. 1 and FIG. 2. The solid-state image sensing device according to the present embodiment is referred to as an image sensor.

FIG. 1 is a block diagram showing an example of the circuit configuration of a module according to the present embodiment. FIG. 2 is a schematic diagram showing an example of the structure of the module according to the present embodiment. The module that includes the image sensor according to the present embodiment is hereinafter referred to as a camera module.

As shown in FIG. 1, a camera module 1 includes an image sensor 100. The image sensor 100 converts incident light (light from a subject) corresponding to an image to an electrical signal. The camera module 1 includes, for example, an image processing unit 101, a calculating unit 102, an input/output unit 103, and an optical lens 104.

The image processing unit (e.g., digital signal processor [DSP]) 101 processes the electrical signal output from the image sensor 100.

The input/output unit 103 functions as an interface for signals from the module 1 and for external signals.

The calculating unit (e.g., a microprocessing unit [MPU]) 102 controls the overall operation of the module 1 in accordance with the external signals.

The optical lens unit 104 collects the incident light to the image sensor 100, and focuses an image corresponding to the incident light on the image sensor 100.

As shown in FIG. 2, the image sensor (image sensor chip) 100 is provided on a mounting substrate 200. The image sensor 100 is connected to interconnects (not shown) formed on the mounting substrate 200 by electrodes (e.g., solder balls) 118 and bonding wires (not shown).

A stack 114 of, for example, a filter and a protective film is attached on the image sensor 100 via an adhesive agent.

A lens holder 117 including the optical lens unit 104 is attached to the image sensor 100. Light from the optical lens unit 104 is applied to a pixel array in the chip via a microlens array ML attached to the image sensor 100. A shield 119 is attached to the image sensor 100 and the lens holder 117 to cover the side surface of the image sensor 100.

Figure 4:
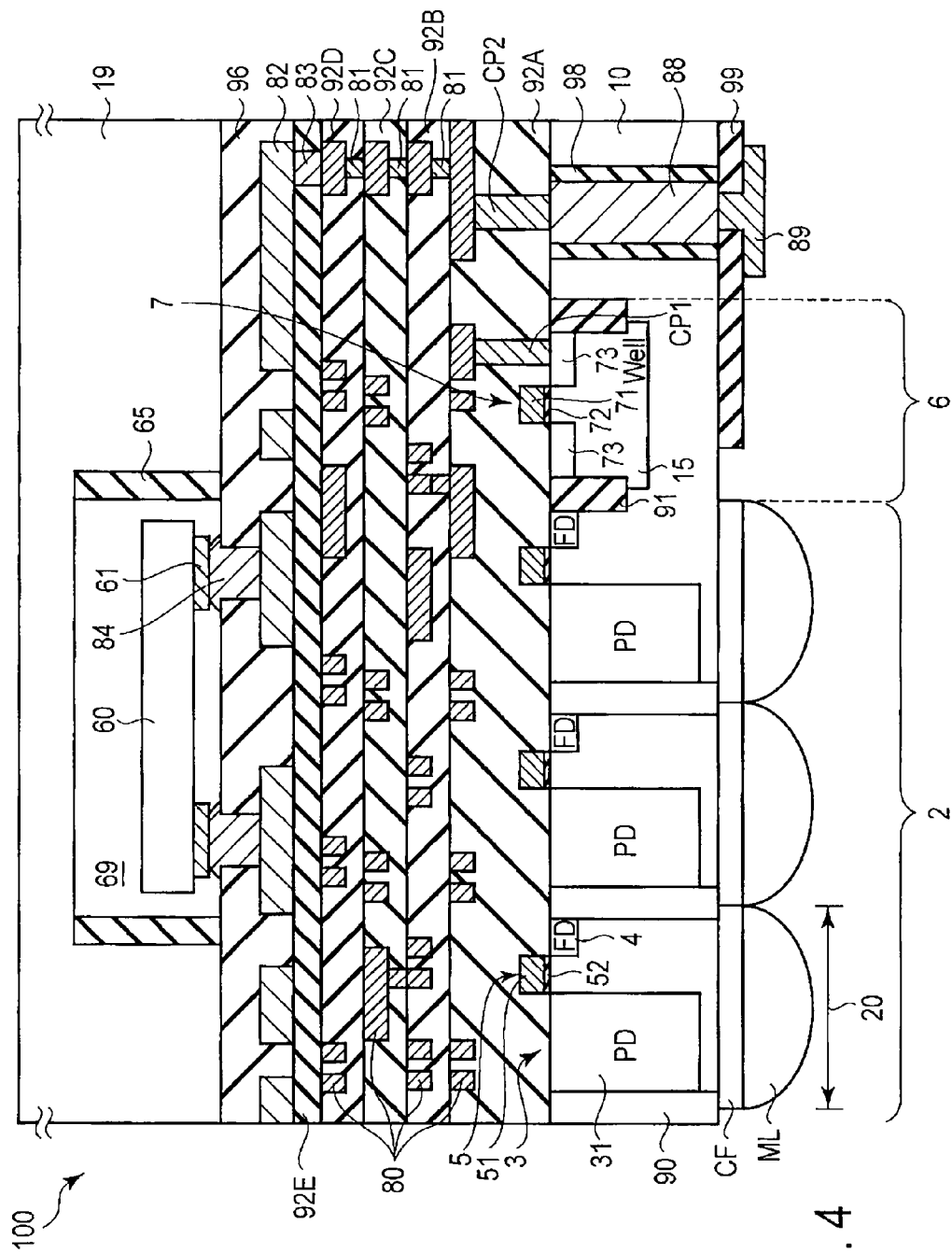
FIG. 4 is a sectional view illustrating the structure of a solid-state image sensing device according to a first embodiment.

The structure of the solid-state image sensing device (image sensor) according to the present embodiment is described with reference to FIG. 3 and FIG. 4. FIG. 3 is a schematic diagram showing an example of the chip layout in the image sensor according to the present embodiment. FIG. 4 is a schematic sectional view showing the structure of the image sensor according to the present embodiment.

As shown in FIG. 3, a pixel array 2 and a peripheral region 6 are provided in one semiconductor substrate 10 in the image sensor 100 according to the present embodiment. The semiconductor substrate 10 is, for example, a p-type silicon substrate (bulk substrate). The semiconductor substrate 10 is not exclusively the silicon substrate, and may be, for example, a silicon layer (epitaxial layer) formed on an insulator of a silicon-on-insulator (SOI) substrate. The semiconductor substrate 10 is an element formation substrate in which elements are formed.

For example, on the semiconductor substrate 10, a pad (not shown) is provided to connect the image sensor 100 to other devices (circuits).

As shown in FIG. 3 and FIG. 4, cell formation regions 20 each including at least one photoelectric conversion element 3 are two-dimensionally arranged in the pixel array 2. The cell formation region 20 is a semiconductor region provided in the semiconductor substrate 10. In the present embodiment, one photoelectric conversion element 3 corresponds to one pixel. The photoelectric conversion element 3 is, for example, a photodiode.

For example, a CMOS sensor or a CCD sensor is formed by using the photodiode 3. The photodiode 3 photoelectrically converts the incident light corresponding to an image to an electrical signal (charge, voltage) conforming to the amount of the incident light. The photodiode 3 stores a charge generated in an impurity layer 31 in accordance with the amount of the incident light.

As shown in FIG. 4, the photodiode 3 is formed in the semiconductor substrate (or semiconductor layer) 10.

The photodiode 3 is formed by at least one impurity layer 31 formed in the semiconductor substrate 10. When the semiconductor substrate 10 has a p-conductivity type, at least one impurity layer 31 has an n-conductivity type. However, in order to improve the characteristics (e.g., sensitivity) of the photodiode 3, the photodiode 3 may be formed by impurity layers different in conductivity type and impurity concentration.

The formation region of the photodiode 3 (photodiode formation region) is provided in the cell formation region 20. The cell formation region 20 includes at least one photodiode formation region.

An impurity layer 4 as a floating diffusion (floating diffusion layer, detecting unit) 4 is provided in the semiconductor substrate 10. The impurity layer 4 has, for example, n-conductivity type. The impurity layer 4 as the floating diffusion retains a charge output from the photodiode 3 via a later-described field effect transistor 5. The potential of the floating diffusion 4 varies with the amount of charge output to the impurity layer 4. The variation of the potential is detected as an electrical signal conforming to the amount of the incident light.

Field effect transistor 5 is provided on the semiconductor substrate 10 between the photodiode 3 and the floating diffusion 4. Field effect transistor 5 is, for example, an n-channel type MOS transistor. Field effect transistor 5 uses, as a source and a drain, for example, the n-type impurity layer 31 included in the photodiode 3 and the n-type impurity layer 4 as the floating diffusion. A gate electrode 51 of field effect transistor 5 is provided on a channel region in the semiconductor substrate 10 across a gate insulating film 52.

One end (source) of the current path of field effect transistor 5 is connected to the cathode of the photodiode 3, and the other end (drain) of the current path of field effect transistor 5 is connected to the floating diffusion 4. The anode of the photodiode 3 is connected to a ground potential. Field effect transistor 5 controls the release of a charge from the photodiode 3 to the floating diffusion 4. When field effect transistor 5 is off, the charge is kept stored in the photodiode 3. When field effect transistor 5 is on, the charge stored in the photodiode 3 is output to the floating diffusion 4 via the channel of field effect transistor 5 that is on. Thus, transistor 5 which controls the storage/release of the charge in the photodiode 3 is referred to as a transfer gate 5.

Cells 20 are provided in the cell formation regions 20 of the pixel array 2. The cell 20 is used as a control unit of a pixel. The cell 20 includes at least the photodiode 3, the floating diffusion 4, and the transfer gate 5. However, in addition these components, the cell 20 may include other components depending on the circuit configuration of the image sensor. For example, the cell 20 includes field effect transistors called an amplifier transistor and a reset transistor as components.

For example, the gate electrode of the amplifier transistor is connected to the floating diffusion. The source of the reset transistor is connected to a power supply, and the drain of the reset transistor is connected to the floating diffusion 4 and the source of the amplifier transistor. The drain of the amplifier transistor is connected to a signal line from which signals of the pixels are output. The amplifier transistor forms a source follower, and amplifies output signals (output voltages) from the cells (pixels) in accordance with the potential level of the floating diffusion 4. The reset transistor resets the potential level of the floating diffusion 4. The cell may also include a field effect transistor called an address transistor. The address transistor activates a selected cell in accordance with a control signal.

The structure of the cell may be a one-pixel one-cell structure or may be a two-pixel one-cell structure. In the two-pixel one-cell structure, two photodiodes 3 are connected to one floating diffusion.

An element isolation region is provided in the semiconductor substrate 10 to surround the adjacent cell formation regions and the adjacent pixels. The adjacent pixels are electrically isolated from each other by the element isolation region. An element isolation layer 90 is provided in the element isolation region in the pixel array 2. In the pixel array 2, the element isolation layer 90 is formed, for example, by an impurity layer (referred to as an element isolation impurity layer). The element isolation layer may be formed by an insulating film having an STI structure (element isolation insulating film).

As shown in FIG. 3 and FIG. 4, the peripheral region 6 is provided in the semiconductor substrate 10 to be adjacent to the pixel array 2.

Peripheral circuits such as an analog circuit and a logic circuit are provided in the peripheral region 6. More specifically, a circuit such as a row or column selection circuit for controlling the operation of the pixel array 2, and a circuit such as an analog-to-digital conversion circuit for processing a signal from the pixel array 2 are provided in the peripheral region 6.

The peripheral region 6 is electrically isolated from the pixel array 2, for example, by the element isolation region. For example, an element isolation insulating film 91 having an STI structure is embedded in the element isolation region for dividing the peripheral region 6.

The circuits in the peripheral region 6 include elements such as a field effect transistor 7, a resistive element, and a capacitive element. In FIG. 4, field effect transistor 7 is only shown for the simplification of the drawing. Moreover, although one field effect transistor is only shown in FIG. 4, more than one transistor are provided on the semiconductor substrate 10.

For example, in the peripheral region 6, the field effect transistor (e.g., MOS transistor) 7 is provided in a well region 15 in the semiconductor substrate 10. Two diffusion layers (impurity layers) 73 are provided in the well region 15. These two diffusion layers 73 function as the source/drain of field effect transistor 7. A gate electrode 71 is provided on the surface of the well region (channel region) between the two diffusion layers 73 via a gate insulating film 72. As a result, field effect transistor 7 is formed in the well region 15.

Whether field effect transistor 7 is a p-channel type or an n-channel type is determined by the conductivity type of the well region 15 where transistor 7 is provided and by the conductivity types of the diffusion layers 73 serving as the source/drain. The field effect transistor may be an enhancement type or a depression type.

Interlayer insulating films 92A, 92B, 92C, 92D, and 92E are stacked on the semiconductor substrate 10 to cover the gate electrodes 51 and 71 of transistors 5 and 7 and the upper surfaces of the photodiode 3. For example, silicon oxide is used for interlayer insulating films 92A, 92B, 92C, 92D, and 92E.

A multilayer interconnect technique is used for the image sensor according to the present embodiment. That is, interconnects (wiring lines) 80 are provided in the stacked interlayer insulating films 92A, 92B, 92C, 92D, and 92E in accordance with each interconnect level (height based on the surface of the substrate). By plugs 81, CP1, and CP2 that are embedded in each of interlayer insulating films 92A, 92B, 92C, 92D, and 92E, the interconnects 80 are electrically connected to other interconnects located at an interconnect level immediately above the interconnect level of these interconnects 80. In addition, each interconnect 80 includes a light blocking film which prevents the diffraction of light in the interlayer insulating film, and a dummy layers which are not connected to the elements and the circuits.

The gate electrodes 51 and 71 of transistors 5 and 7, the source/drain 73, and the terminals of the elements formed on the semiconductor substrate 10 are connected to the interconnect 80 located at the first (lowermost) interconnect level from the substrate 10 via contact plug CP1. The interconnects 80 connect the elements provided on the semiconductor substrate 10. As a result, circuits are formed.

Interlayer insulating film 92A is located at the lowermost interconnect level from the semiconductor substrate 10. Interlayer insulating films 92B, 92C, 92D, and 92E are stacked in order on interlayer insulating film 92A. In the present embodiment, interlayer insulating film 92E is the uppermost interlayer insulating film. Interlayer insulating films 92A, 92B, 92C, 92D, and 92E at the respective interconnect levels are represented below as an interlayer insulating film 92 when not distinguished from one another.

Here, in the present embodiment, a surface in which elements are formed, more specifically, the surface (first surface) of the semiconductor substrate 10 in which the gate electrodes 51 and 71 of transistors 5 and 7 are provided is referred to as a front surface of the semiconductor substrate 10. Interlayer insulating films 92A, 92B, 92C, 92D, and 92E formed by the multilayer interconnect technique are provided on the front surface of the semiconductor substrate 10. The surface (second surface) of the semiconductor substrate 10 opposite to the front surface is referred to as a back surface (or rear surface).

In the present embodiment, a color filter CF is provided on the back surface of the semiconductor substrate 10, for example, via a protective layer (not shown) and an adhesive layer (not shown), as shown in FIG. 4. The color filter CF is provided on the back surface of the semiconductor substrate 10 above the pixel array 2. For one pixel (photodiode 3), the color filter CF includes, for example, a filter which transmits light having a wavelength corresponding to red (R), a filter which transmits light having a wavelength corresponding to green (G), and a filter which transmits light having a wavelength corresponding to blue (B). These filters are arranged with a predetermined pattern. The color filter CF may have a yellow filter or a white (W) filter that transmits all visible light wavelength bands in addition to the red, green, and blue. The color filter CF has an arrangement pattern such as a bayer arrangement or a WRGB arrangement.

A microlens array ML is mounted on the color filter CF via the protective layer (not shown) and the adhesive layer (not shown).

The microlens array ML is provided above the pixel array 2 via the color filter CF. The microlens array ML is formed so that microlenses each corresponding to one pixel (photodiode 3) are two-dimensionally arranged. The microlens array ML focuses incident light. The adhesive layer/protective layer for attaching the microlens ML and the color filter CF have the property of transmitting the incident light.

The surface to which the microlens array ML is attached is the back surface of the semiconductor substrate 10. Thus, in the image sensor according to the present embodiment, the microlens array ML and the color filter are provided on the surface (back surface) opposite to the surface (front surface) in which the gate electrode 71 and the interlayer insulating film 92 of the transistor are provided. The semiconductor substrate 10 in which the elements are formed intervenes between the interlayer insulating film 92 and the microlens array ML.

The incident light (light from the subject) as an image is applied to the pixel array 2 from the back surface of the semiconductor substrate 10 via the microlens array ML and the color filter CF.

An image sensor, such as the image sensor according to the present embodiment, having a structure in which light from the back surface opposite to the front surface of the substrate where the elements are formed is applied to the pixels is referred to as a back side illumination type image sensor.

A through-hole (opening) is formed in the semiconductor substrate 10, for example, by a through silicon (or substrate) via (TSV) technique to pass through the semiconductor substrate 10 from the front side of the semiconductor substrate 10 to the back side. A via (through via) 88 is embedded in the through-hole. An insulating layer 98 is provided on the side surface of the through-hole, and the through via 88 is electrically isolated from the semiconductor substrate 10 by insulating layer 98.

The through via 88 is connected to the interconnects 80 in the interlayer insulating film 92 via contact plug CP2. The through via 88 is also connected to a pad (electrode) 89 provided on the back surface of the semiconductor substrate 10. The pad 89 is provided on the through via 88 and on an insulating layer 99. The pad 89 is electrically isolated from the semiconductor substrate 10 by insulating layer 99. Thus, in the back side illumination type image sensor, the pad 89 may be provided on the back surface of the semiconductor substrate 10.

In the back side illumination type image sensor, a peripheral region may be provided on the back surface of the semiconductor substrate 10, and elements may be formed in the peripheral region on the back surface. This allows the reduction of a chip size in the image sensor.

An interconnect 82 formed by a re-distribution (rewiring) technique is provided on the uppermost interlayer insulating film 92E. The interconnect 82 formed by the re-distribution technique is hereinafter referred to as a re-distribution line (re-distribution layer) 82. The re-distribution line 82 is covered with an insulating layer (e.g., resin layer) 96. Insulating layer 96 and the interlayer insulating film 92 cover the front surface of the semiconductor substrate 10. The re-distribution line 82 is connected to the interconnect 80 via an electrode (via plug) 83. The re-distribution line 82 is connected to, for example, a pad (not shown). Insulating layer 96 and the re-distribution line 82 may be an insulating film and an interconnect that are formed by the multilayer interconnect technique.

Signals are input/output between the image sensor 100 and an external device or a voltage is supplied to the image sensor 100 by the re-distribution line (pad) 82 on the front surface of the substrate 10 and by the pad 89 on the back surface of the substrate 10.

A support substrate 19 is provided on insulating layer 96. The support substrate 19 is stacked on insulating layer 96, for example, via the protective layer (not shown) and the adhesive layer (not shown). For example, a silicon substrate or an insulating substrate is used for the support substrate 19. The thickness (dimension in the stacking direction) of the support substrate 19 is, for example, about 200 to 400 μm. The thickness from the bottom surface (back surface, rear surface) of the semiconductor substrate 10 to insulating layer 96 covering the re-distribution line 82 is, for example, about 4 to 6 μm. Thus, the support substrate 19 is thicker than the semiconductor substrate 10 in which the pixels are formed.

In the image sensor according to the present embodiment, a trench 69 is provided in the support substrate 19. The surface of the support substrate 19 in which an opening for the trench 69 is formed is attached to insulating layer 96. An air gap (also referred to as a cavity) is formed by the trench 69 and insulating layer 96.

Devices (electronic components) 60 are provided in the trench (air gap) 69. These devices 60 are, for example, passive elements for forming a module such as a chip condenser. Alternatively, the devices 60 are semiconductor chips for forming modules such as a driver chip, a DSP chip 101, and an MPU chip 102. However, the devices 60 may be elements for forming the image sensor. The characteristics and kinds of devices 60 are properly selected to suit to the specification of the camera module.

For example, a vacuum is formed in the trench (air gap) 69. The trench 69 may contain an insulator such as an inert gas or air or a resin for the devices 60 and the support substrate 19.

In the back side illumination type image sensor according to the present embodiment, the device 60 used as the component of the camera module is stacked on insulating films 92 and 96 covering the front surface of the semiconductor substrate 10, and the device 60 is accommodated (stored) in the trench (air gap) 69 formed in the support substrate 19. In the present embodiment, the device 60 used as the component of the camera module is also referred to as a module formation device.

An electrode (terminal) 61 provided in the device 60 is electrically connected to a connection terminal 84. The device 60 is connected to the elements and the circuits on the semiconductor substrate 10 by the connection terminal 84 via the re-distribution line 82 and the interconnect 80. For example, the connection terminal 84 is a solder ball (solder electrode).

In the trench 69 formed in the support substrate 19, a sidewall insulating film 65 is provided on the support substrate 19 along the inner surface of the trench 69. This inhibits the wrong operation of the image sensor caused by contact (a short circuit) between the support substrate 19 and the device 60 and the drop in the production yield of the image sensor (module). Insulating film 65 is not exclusively formed on the side surface of the trench formed in the support substrate 19 as shown in FIG. 4, and may be formed on the bottom of the trench 69 (the side of the trench 69 opposite to the opening).

A pad may be formed on the support substrate 19. This pad is connected to the re-distribution line 82 via the through via formed in the support substrate 19.

Although one trench 69 is formed in the support substrate 19 and one device is provided in the trench 69 in the example shown in FIG. 4, the present embodiment is not limited to this number. For example, more than one trench 69 may be formed in the support substrate 19, and the device 60 may be provided in each of the trenches 69, or more than one device 60 may be provided in one trench 69. The size and number of the trenches 69 formed in the support substrate 19 are not particularly limited as long as the devices 60 can be accommodated therein and the strength of the support substrate 19 is ensured.

For example, depending on the specification of the camera module, the characteristics of the passive elements as the devices 60 and the chip performance are properly selected in accordance with user demands. These devices 60 are mounted in the camera module together with the image sensor 100.

As shown in FIG. 4, in the image sensor 100 according to the present embodiment, the devices 60 including at least one of the passive elements and the semiconductor chips are provided in the trench 69 in the support substrate 19. The devices 60 are then connected to the circuits on the semiconductor substrate 10 that form the image sensor 100 by the re-distribution line 82 on the interlayer insulating film 92. The devices 60 (module components) 60 used in the camera module are accommodated (enveloped) in the trench 69 of the support substrate 19, and the devices 60 are stacked on insulating films 92 and 96 covering the front surface of the semiconductor substrate 10.

As a result, the mounting area (occupancy area) of the devices 60 on the mounting substrate 200 can be reduced, and the area of the mounting substrate 200 can be reduced accordingly. Therefore, the area of the camera module 1 can be smaller in the image sensor 100 according to the present embodiment than when the devices 60 are mounted on the mounting substrate 200 to be adjacent to the image sensor chip in a direction parallel to the front surface of the mounting substrate 200. Moreover, when all the devices for forming the module are stacked on the image sensor chip to be accommodated in the trench in the support substrate 19, the camera module can be formed so that the size of the mounting substrate 200 is substantially the same as the chip size of the image sensor 100, or the camera module can be formed without using the mounting substrate 200. In this case, the camera module can be further reduced in size.

Furthermore, because of the devices 60 are provided in the trench (air gap) 69 of the support substrate 19 in the image sensor according to the present embodiment, the increase in the thickness (dimension in the stacking direction) of the chip and the module can be inhibited in the image sensor according to the present embodiment as compared with the case where the devices 60 are simply stacked on the support substrate 19 or as compared with the case where the image sensors 100 and the devices 60 that are formed on different substrates are stacked.

Thus, the image sensor according to the present embodiment can contribute to the size reduction of the camera module.

Consequently, according to the solid-state image sensing device of the present embodiment, the module can be reduced in size.

(b) Manufacturing Method

A method of manufacturing the solid-state image sensing device (image sensor) according to the first embodiment is described with reference to FIG. 1 to FIG. 9. FIG. 5 to FIG. 9 show the sectional structure in the steps of the manufacturing method according to the present embodiment. In the method of manufacturing the image sensor according to the present embodiment, the order of the formation of the components described later may be properly changed as long as process consistency is ensured.

Figure 5:
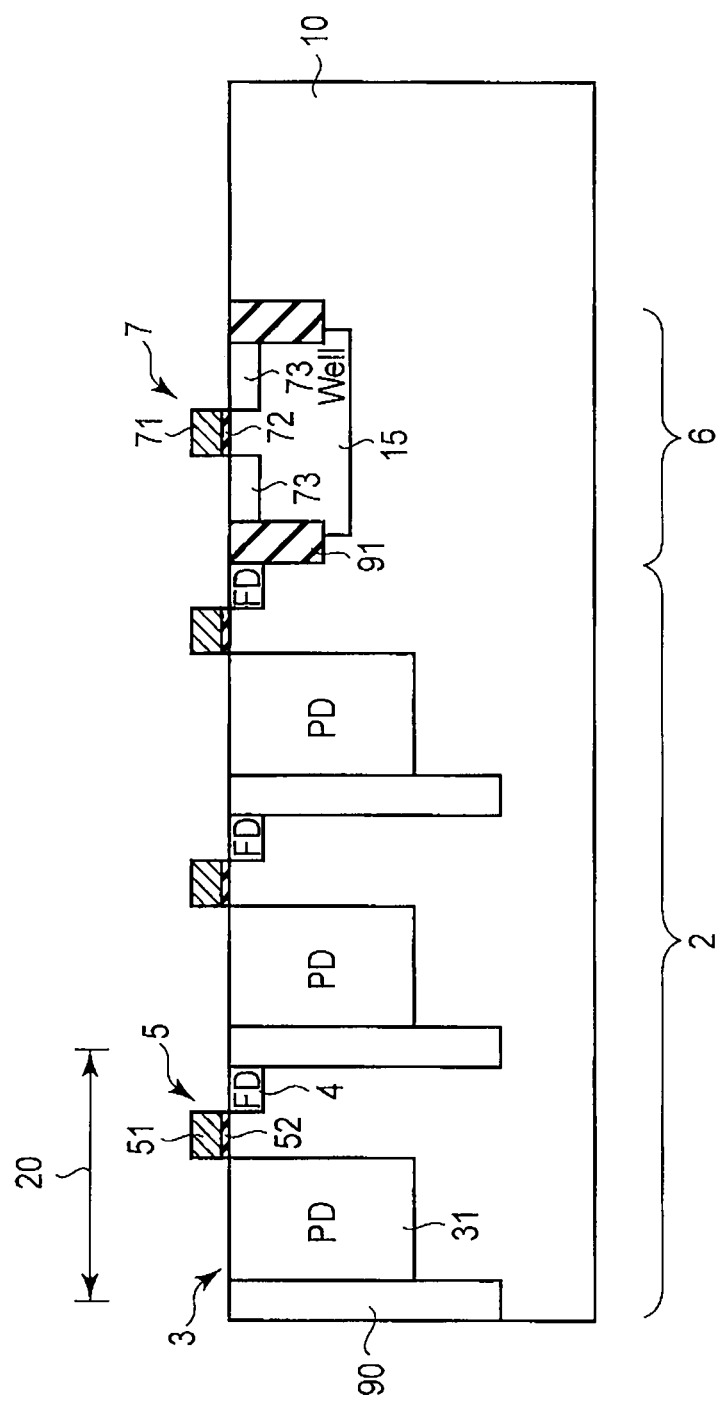
FIG. 5 is a sectional view showing a step in a method of manufacturing the solid-state image sensing device according to the first embodiment.

As shown in FIG. 5, p-type and n-type well regions 15 and element isolation regions 90 and 91 are formed in a semiconductor substrate 10, for example, a p-type silicon substrate 10. The semiconductor substrate 10 may otherwise be an SOI substrate.

The well regions 15 and the element isolation impurity layer 90 are formed at predetermined positions in the semiconductor substrate 10 under the control of a mask formed by a photolithographic technique or the acceleration energy of impurity ions in ion implantation.

An element isolation trench is formed in the semiconductor substrate 10 by the photolithographic technique and reactive ion etching (RIE). An insulator is embedded in the element isolation trench by a chemical vapor deposition (CVD) method or a coating method, and an element isolation insulating film 91 is formed at a predetermined position in the semiconductor substrate 10.

As a result, the element isolation region (insulating film or impurity layer) that electrically isolates the adjacent elements is formed in the semiconductor substrate 10, and a pixel array 2 and a peripheral region 6 adjacent thereto are marked off in the semiconductor substrate 10. A cell formation region 20 is formed in the pixel array 2. The cell formation region 20 includes at least one pixel formation region (photodiode formation region). The photodiode formation region is surrounded by the element isolation region in the cell formation region 20.

A resist mask (not shown) is formed in the cell formation region 20 of the pixel array 2 by the photolithographic technique. The resist mask has an opening at the formation position of a photoelectric conversion element (e.g., photodiode). At least one impurity layer 31 is formed in the semiconductor substrate 10 by an ion implantation method using the resist mask. When the semiconductor substrate 10 is a p-type semiconductor substrate, the impurity layer 31 is, for example, an n-type impurity layer. Thus, a photodiode 3 corresponding to each pixel of the image sensor is formed in the cell formation region 20 in the pixel array 2.

An impurity layer 4 as a floating diffusion is formed in the semiconductor substrate 10 at a predetermined position in the cell formation region 20 of the pixel array 2 by the photolithographic technique and the ion implantation method.

Furthermore, gate insulating films 52 and 72 are formed on the semiconductor substrate 10, for example, by a thermal oxidation method. A silicon layer is deposited on the gate insulating films 52 and 72 by the CVD method. Gate electrodes 51 and 71 having predetermined gate length and gate width are formed on the front surface (first surface) of the semiconductor substrate 10 across the gate insulating films 52 and 72 by the photolithographic technique and the RIE method. For example, the formed electrode 71 is used as a mask, and impurity layers (diffusion layers) 73 as a source and a drain are formed in the semiconductor substrate 10 by the ion implantation method. As a result, a transfer gate 5, a field effect transistor for forming a cell, and a field effect transistor 7 for forming a peripheral circuit are respectively formed in the pixel array 2 and the peripheral region 6 on the front surface of the semiconductor substrate 10. The transfer gate 5 and another field effect transistor 7 may be formed in the simultaneous process or in different processes.

Figure 6:
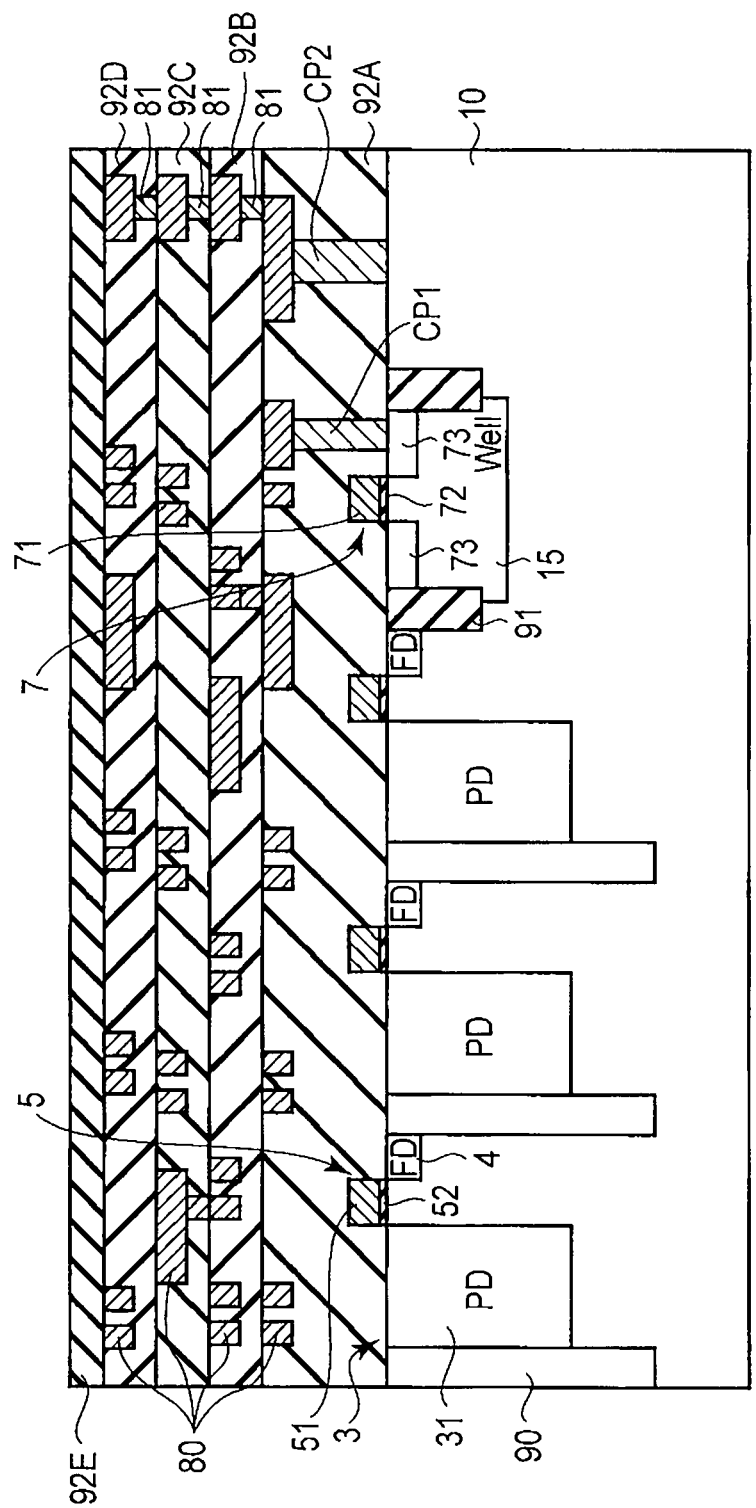
FIG. 6 is a sectional view showing a step in the method of manufacturing the solid-state image sensing device according to the first embodiment.

As shown in FIG. 6, for example, by the CVD method, an interlayer insulating film 92A is deposited on the front surface of the semiconductor substrate 10 in which the elements are formed. Interlayer insulating film 92A covers, for example, the gate electrodes 51 and 71 of transistors 5 and 7. After the upper surface of interlayer insulating film 92A is planarized, for example, by a chemical mechanical polishing (CMP) method, contact holes are formed in interlayer insulating film 92A by the photolithographic technique and the RIE method. Contact plugs CP1 and CP2 are embedded in the formed contact holes. For example, a metal film of aluminum or copper is deposited on interlayer insulating film 92A and contact plugs CP1 and CP2, for example, by a sputtering method. The deposited metal film is fabricated into a predetermined shape by the photolithographic technique and the RIE method to be connected to contact plugs CP1 and CP2. As a result, an interconnect 80 is formed in interlayer insulating film 92A.

In a substantially similar process, interlayer insulating films 92B, 92C, 92D, and 92E, a via plug 81, and the interconnects (or dummy layers) 80 are sequentially formed on interlayer insulating film 92A by the multilayer interconnect technique.

The upper surfaces of interlayer insulating films 92B, 92C, 92D, and 92E are planarized, for example, by the CMP method during the deposition of these interlayer insulating films. The interconnect 80 may be formed by a damascene method.

As described above, in the present embodiment, the surface (first surface) of the semiconductor substrate 10 in which the interlayer insulating film 92 is provided is referred to as a front surface of the semiconductor substrate 10, and a surface opposite to the front surface (opposite surface) is referred to as a back surface (second surface) of the semiconductor substrate 10.

Figure 7:
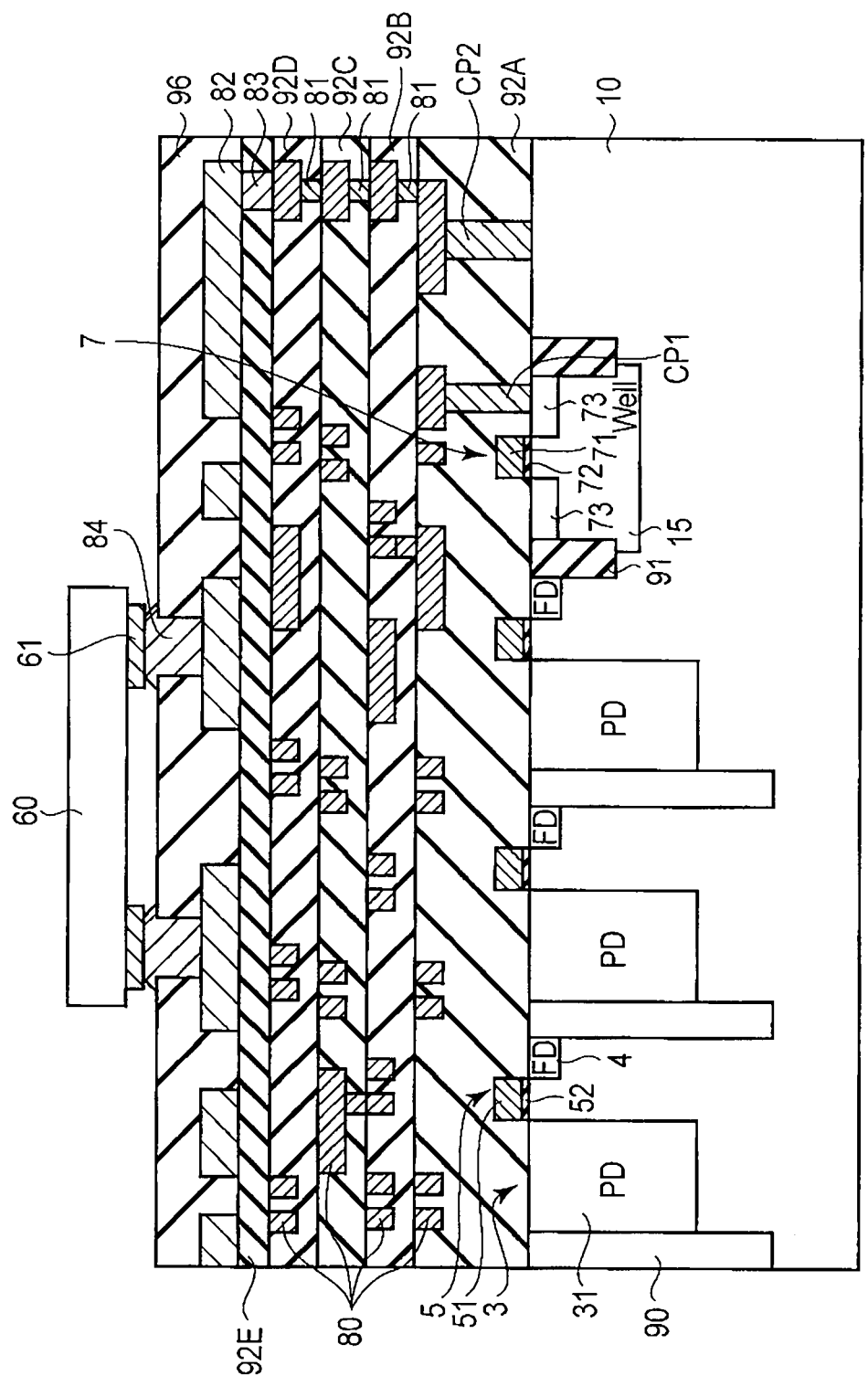
FIG. 7 is a sectional view showing a step in the method of manufacturing the solid-state image sensing device according to the first embodiment.

As shown in FIG. 7, a via plug 83 is formed in interlayer insulating film 92E to be connected to the interconnect 80, and a re-distribution line 82 is formed on the uppermost interlayer insulating film 92E by the re-distribution technique. An insulating layer 96 is formed on the re-distribution line 82 and the interlayer insulating film 92 to cover the re-distribution line 82. The upper surface of insulating layer 96 is planarized.

An opening (contact hole) is formed at a predetermined position in insulating layer 96 so that the upper surface of a predetermined re-distribution line 82 is partly exposed. A conductor (e.g., solder ball) is formed in the formed opening as a connection terminal 84. The formation position of the opening corresponds to the position of the electrode of the device mounted on insulating layer 96.

In the present embodiment, a device (module component) 60 for forming a module is stacked on insulating layer 96. The device 60 is an electronic component having characteristics and performance that fulfill user demands, and is a passive element such as a chip condenser or a semiconductor chip such as a driver chip. However, the device 60 may be a device for forming the image sensor.

An electrode 61 of the device 60 is joined to the connection terminal 84, so that the device 60 is fixed on the connection terminal 84 and insulating layer 96. The device 60 is connected to the elements and circuits formed on the semiconductor substrate 10 via the re-distribution line 82 and the interconnect 80. Although one device 60 is provided on insulating layer 96 in the example shown in FIG. 7, more than one device 60 may be provided on insulating layer 96.

As shown in FIG. 8A, in a process separate from the process shown in FIG. 5 to FIG. 7, a trench 69 is formed at a predetermined position in a support substrate 19, for example, by the photolithographic technique and the RIE method before the support substrate (e.g., silicon substrate) 19 is attached above the interlayer insulating film 92 that covers the front surface of the semiconductor substrate 10. The trench 69 is formed to correspond to the position on the chip where the device 60 is attached. The opening dimensions of the trench 69 and the depth of the trench 69 are properly adjusted in accordance with the size of the device 60 stacked on the interlayer insulating film 92. More than one trench 69 may be formed in the support substrate 19 in accordance with the number of devices 60 to be mounted.

An insulating film 65X is formed on the support substrate 19 and in the trench 69, for example, by the CVD method. In this case, insulating film 65X is set to a thickness at which the trench 69 is not filled with insulating film 65X.

Insulating film 65X is then etched back. Accordingly, as shown in FIG. 8B, a sidewall insulating film 65 remains on the side surface of the support substrate 19 in the trench 69. Insulating film 65X may remain on the bottom of the trench 69. Moreover, insulating film 65X do not have to be etched back.

Figure 9:
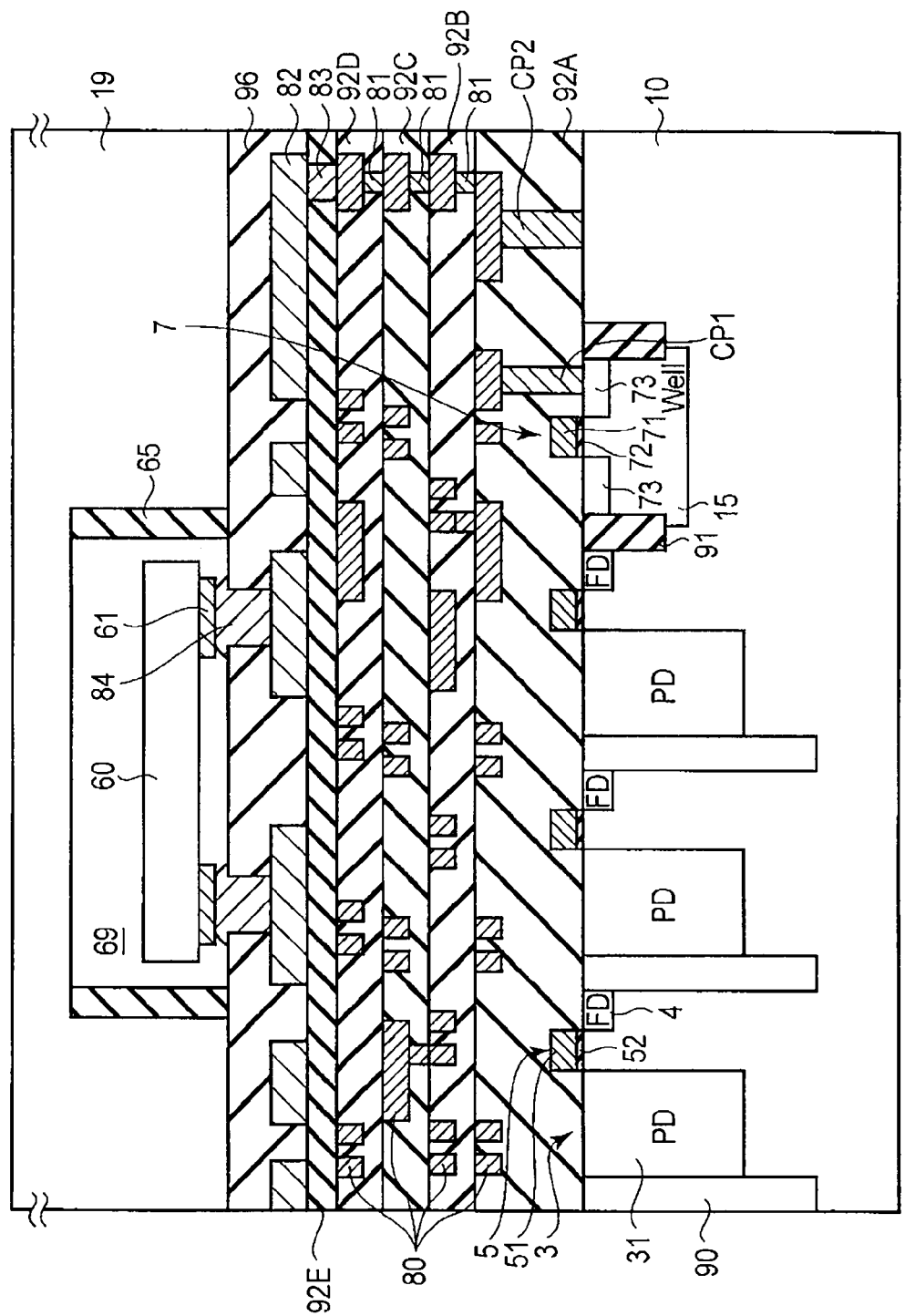
FIG. 9 is a sectional view showing a step in the method of manufacturing the solid-state image sensing device according to the first embodiment.

As shown in FIG. 9, the support substrate 19 in which the trench 69 is formed is affixed to insulating layer 96 by using an adhesive agent or by using the covalent bonding of the support substrate 19 and insulating layer 96 so that the surface of the support substrate 19 in which the opening of the trench 69 is formed contacts the upper surface (the surface on which the device 60 is mounted) of insulating layer 96.

As described above, the sidewall insulating film 65 is formed on the side surface of the trench 69. Therefore, a short circuit between the support substrate 19 and the device 60 can be prevented even if the support substrate 19 contacts the device 60 due to misalignment between the support substrate 19 and the semiconductor substrate 10 during the attachment of the support substrate 19. This can inhibit the wrong operation of the image sensor and the drop in the production yield of the camera module including the image sensor.

In this way, a structure in which the device 60 on insulating films 92 and 96 covering the semiconductor substrate 10 is accommodated in the trench 69 of the support substrate 19 is formed. In the air gap (trench) in which the device 60 is accommodated, air or a process gas may be contained or a vacuum may be formed depending on gas atmosphere during the attachment of the support substrate 19.

Subsequently, the back surface of the semiconductor substrate 10 is subjected to, for example, grinding, CMP, or wet etching so that the semiconductor substrate 10 is reduced to, for example, a thickness of about 4 to 6 μm. For example, as shown in FIG. 4, a through-hole is formed in the semiconductor substrate 10, and an insulating film 98 is formed on the side surface of the through-hole. A through plug 88 is then formed in the semiconductor substrate 10, and a pad 89 is formed on the back surface of the semiconductor substrate 10.

Furthermore, a protective film (insulating film) and an adhesive layer are formed on the back surface of the semiconductor substrate 10. As shown in FIG. 4, a color filter CF and a microlens array ML are then attached on the back surface of the semiconductor substrate 10 to correspond to each pixel (photodiode).

The support substrate 19 is polished into a predetermined thickness (e.g., about 200 to 400 μm). A sealing process using an insulator (resin) is then conducted, and a back side illumination type image sensor 100 is formed. The thickness of the support substrate 19 may be reduced before the color filter CF and the microlens array ML are attached to the semiconductor substrate 10.

After a lens holder 117 and an electrode 118 shown in FIG. 2 are attached to the formed image sensor chip 100, the image sensor 100 is mounted on a mounting substrate 200. As a result, the camera module shown in FIG. 1 and FIG. 2 is formed.

Thus, in the method of manufacturing the solid-state image sensing device according to the present embodiment, for example, in the method of manufacturing the back side illumination type image sensor, the passive elements 60 or semiconductor chips 60 used in the camera module are stacked on insulating films 92 and 96 covering the front surface of the semiconductor substrate 10, as shown in FIG. 7. These devices 60 are connected to the interconnects 80 and 82 of the image sensor 100.

As shown in FIG. 9, the support substrate 19 having the trench 69 is attached on insulating films 92 and 96 covering the front surface of the semiconductor substrate 10 so that the devices 60 are accommodated in the support substrate 19.

The devices 60 for forming the camera module compliant with a required specification are thus stacked on the semiconductor substrate 10 in which the image sensor is formed, such that the devices 60 and the image sensor 100 do not have to be arranged on the mounting substrate 200 in a direction level with the front surface of the substrate. As a result, the area in which the devices 60 are mounted on the mounting substrate 200 can be reduced. Thus, the image sensor according to the present embodiment allows the reduction of the area of the camera module 1.

Moreover, in the present embodiment, the devices 60 and the support substrate 19 are attached on insulating films 92 and 96 covering the front surface of the semiconductor substrate 10 so that the devices 60 are enclosed in the trench 69 formed in the support substrate 19. This can inhibit the increase in the thickness of the chip of the image sensor 100 due to the stacking of the devices 60.

Consequently, according to the method of manufacturing the solid-state image sensing device of the first embodiment, it is possible to provide a solid-state image sensing device that contributes to the size reduction of the module.

(2) Second Embodiment

A solid-state image sensing device (e.g., image sensor) and a manufacturing method of the same according to the second embodiment are described with reference to FIG. 10 to FIG. 12. In the present embodiment, the same components and manufacturing processes as those in the first embodiment are described when necessary.

Figure 10:
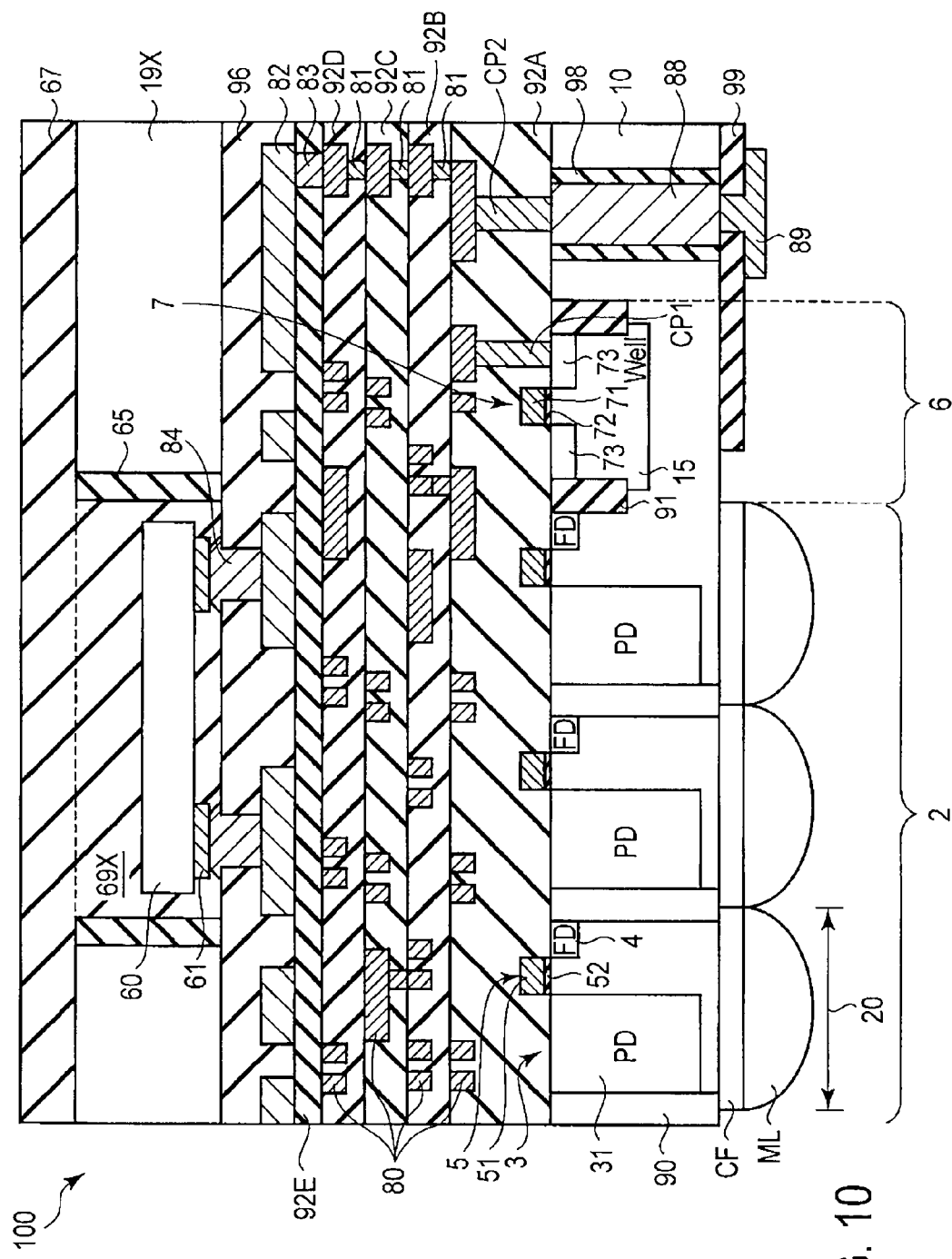
FIG. 10 is a sectional view illustrating the structure of a solid-state image sensing device according to a second embodiment.

FIG. 10 shows the sectional structure of the image sensor according to the present embodiment.

In the example of the image sensor and the manufacturing method of the same described in the first embodiment, the support substrate 19 having the trench 69 is attached on insulating layer 96 after the devices 60 as the components of the module are mounted on insulating layer 96.

However, as in the second embodiment, the devices 60 as the components of the module may be mounted on insulating layer 96 so that the devices 60 are provided in the support substrate 19 after the support substrate 19 is attached on insulating layer 96.

In this case, as in the structure shown in FIG. 10, an opening (trench) 69X in the support substrate 19 is filled with an insulator (e.g., resin) 67, and the devices 60 are covered with the insulator 67.

Figure 11:
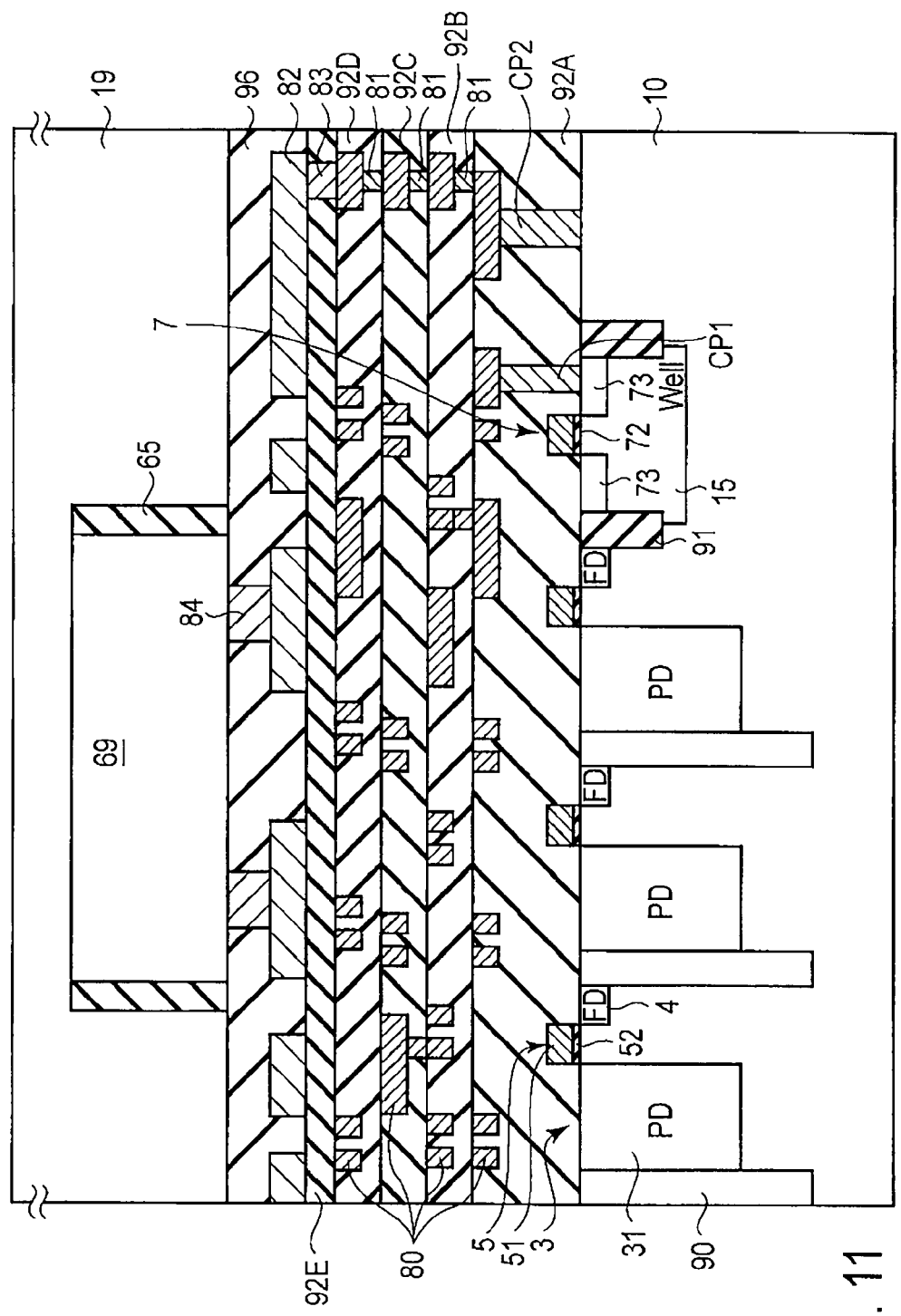
FIG. 11 is a sectional view showing a step in a method of manufacturing the solid-state image sensing device according to the second embodiment.
Figure 12:
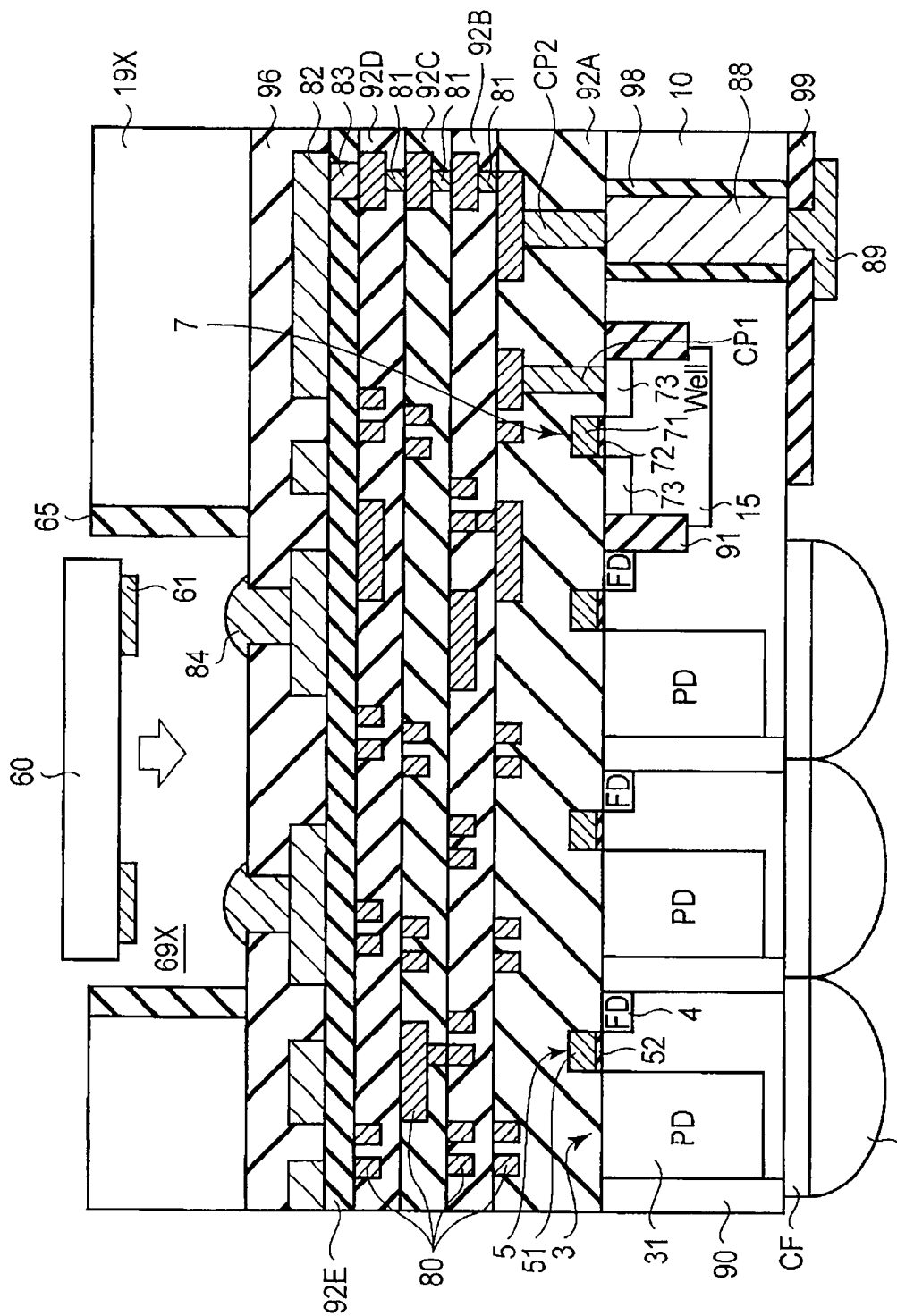
FIG. 12 is a sectional view showing a step in the method of manufacturing the solid-state image sensing device according to the second embodiment.

More specifically, an image sensor 100 according to the present embodiment is formed by the following manufacturing process shown in FIG. 11 and FIG. 12. FIG. 11 and FIG. 12 show the sectional structure in the steps of a manufacturing method according to the present embodiment.

As shown in FIG. 11, by a process substantially similar to the process shown in FIG. 7 according to the first embodiment, a connection terminal 84 is formed at the position where a device (module component) used in the module is mounted. The support substrate 19 having the trench 69 is affixed to insulating layer 96 without the device mounted. The position of the trench 69 corresponds to the mounting position of the device.

Subsequently, substantially as in the manufacturing process described with reference to FIG. 9 to FIG. 4, a color filter and a microlens array are attached on the back surface of a semiconductor substrate 10 reduced in thickness.

As shown in FIG. 12, a support substrate 19X is reduced in thickness, for example, by etching or the CMP method so that an opening which exposes the connection terminal 84 is formed at the position corresponding to the trench. As a result, an opening 69X is formed in the support substrate 19X.

The device 60 for forming the module is mounted on insulating layer 96 via the formed opening 69X. As in the example shown in FIG. 7, an electrode 61 of the device 60 is then connected to the connection terminal 84. The opening 69X may be formed by selective etching at the position of the trench 69.

After the device 60 is connected to the connection terminal 84, the opening 69X is filled with a resin, as shown in FIG. 10. The resin is cured by ultraviolet light or heat, and the device 60 is encapsulated in the opening 69X of the support substrate 19X by the insulator 67.

As described above, the image sensor according to the present embodiment is formed. A color filter CF and a microlens array ML may be attached to the back surface of the semiconductor substrate 10 after the device 60 is mounted.

In the method of manufacturing the image sensor according to the second embodiment, the support substrate 19 having the trench 69 is attached on insulating films 92 and 96 before the device is mounted on insulating films 92 and 96 covering the front surface of the semiconductor substrate 10, as shown in FIG. 11. The device 60 is then mounted on insulating films 92 and 96 via the opening 69X formed in the support substrate 19X after the attachment of the support substrate 19X, as shown in FIG. 12.

Thus, in the image sensor and the manufacturing method of the same according to the present embodiment, the device 60 is stacked on insulating films 92 and 96 as in the first embodiment, so that the mounting area on the mounting substrate 200 and the size of the mounting substrate 200 can be reduced.

Furthermore, in the image sensor according to the present embodiment, the device 60 accommodated in the support substrate 19X is encapsulated and fixed by the insulator 67, thereby inhibiting the device 60 from wrongly detaching from the connection terminal 84. This can inhibit the wrong operation of the image sensor and the drop in the production yield of the image sensor (camera module).

Consequently, according to the solid-state image sensing device and the manufacturing method of the same of the present embodiment, the module can be reduced in size.

(3) Third Embodiment

A solid-state image sensing device (e.g., image sensor) and a manufacturing method of the same according to the third embodiment are described with reference to FIG. 13 and FIG. 14. In the present embodiment, the same components and manufacturing processes as those in the first and second embodiments are described when necessary.

In the examples shown in the first and second embodiments, the support substrate 19 having the trench formed therein is attached on insulating films 92 and 96.

However, the trench does not have to be formed in the support substrate in advance. That is, an opening may be formed in the support substrate at the mounting position of the device 60 used in the module after the support substrate having no trench formed therein is affixed to insulating films 92 and 96.

Figure 13:
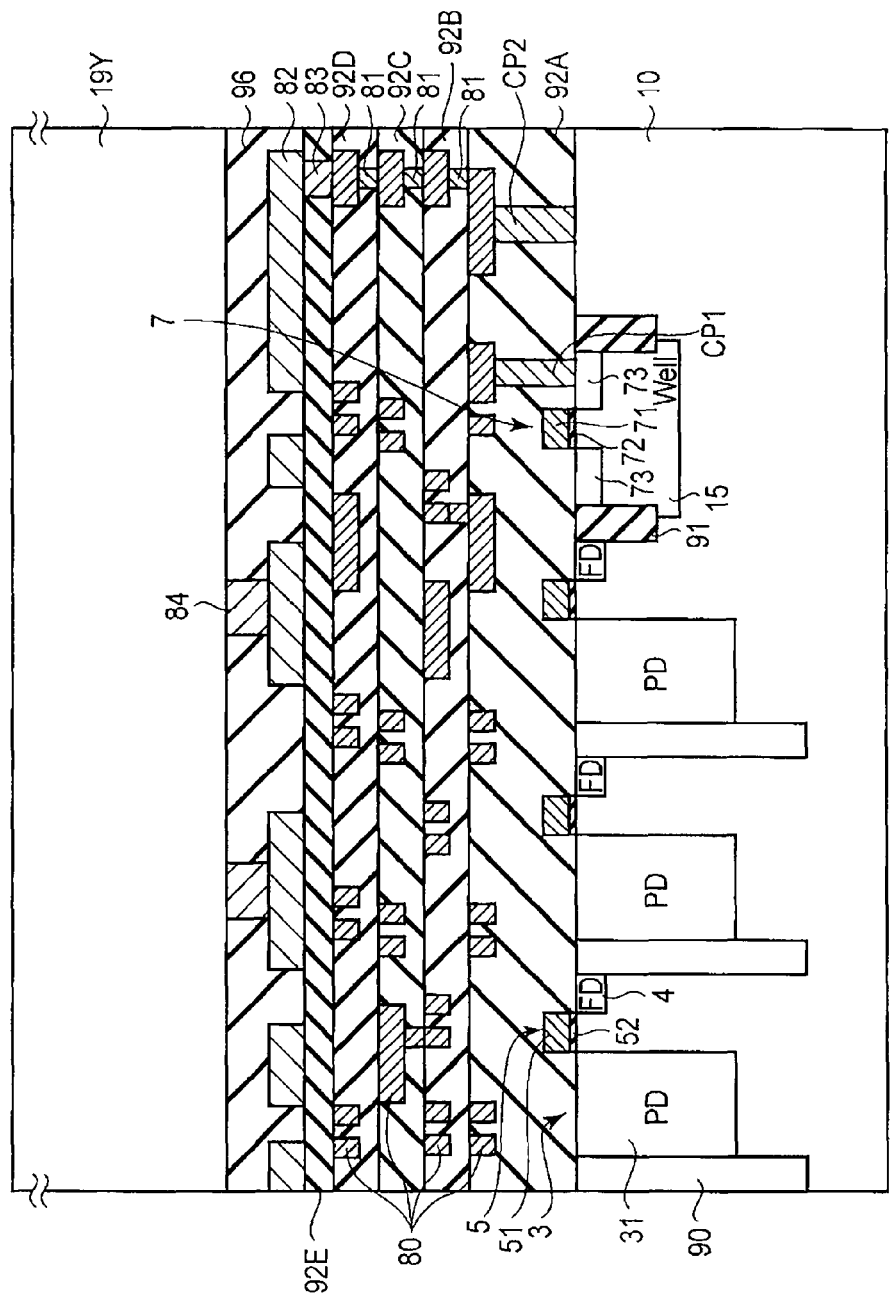
FIG. 13 is a sectional view showing a step in a method of manufacturing a solid-state image sensing device according to the third embodiment.
Figure 14:
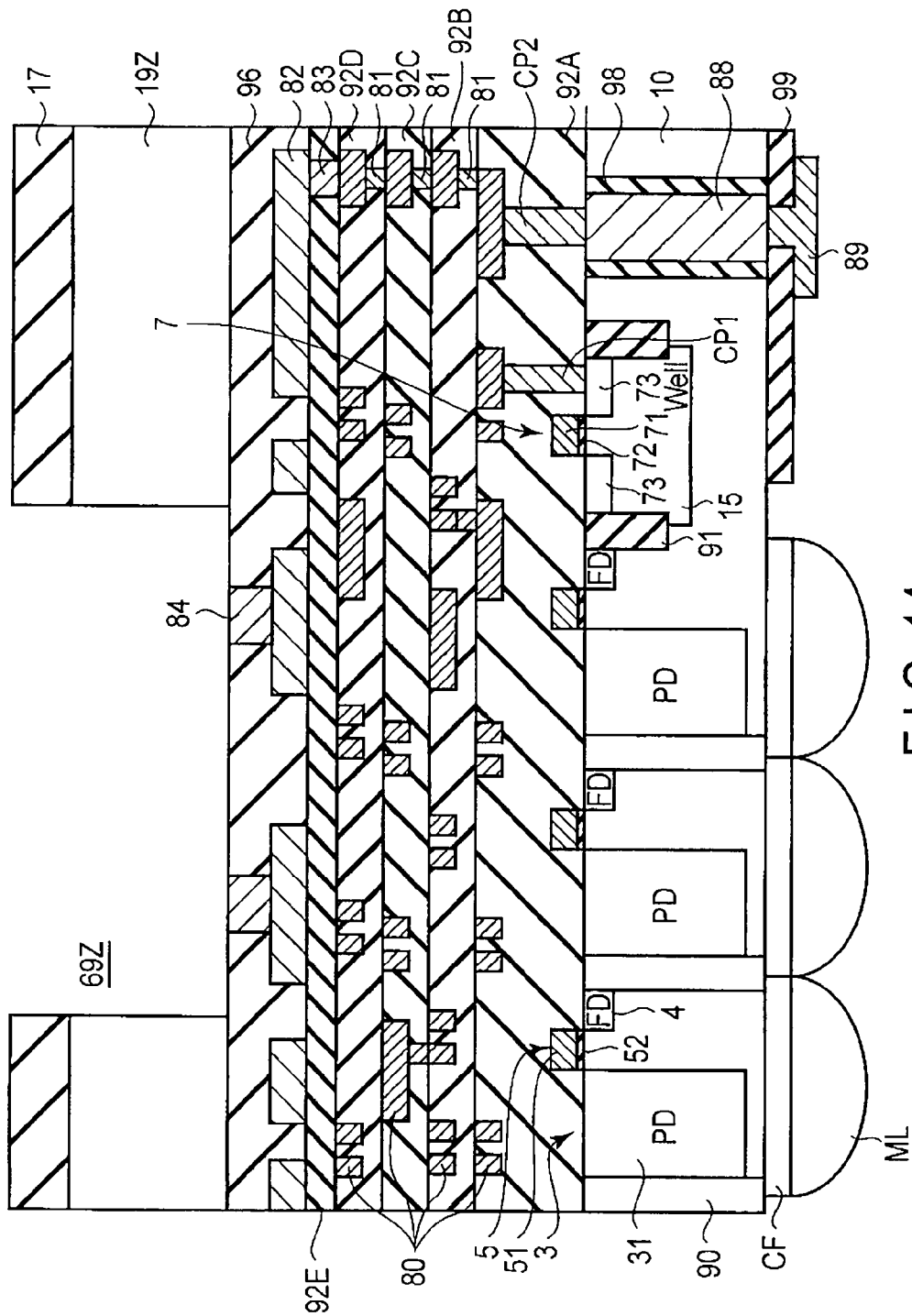
FIG. 14 is a sectional view showing a step in the method of manufacturing the solid-state image sensing device according to the third embodiment.

More specifically, the image sensor according to the present embodiment is formed by the following manufacturing process shown in FIG. 13 and FIG. 14. FIG. 13 and FIG. 14 show the sectional structure in the steps of a manufacturing method according to the present embodiment.

As shown in FIG. 13, by a process substantially similar to the process shown in FIG. 7, a connection terminal 84 is formed to correspond to the mounting position of a device. A support substrate 19Y having no trench formed therein is then affixed to insulating layer 96.

After the support substrate 19Y is attached to insulating layer 96, a color filter CF and a microlens array ML are attached to the back surface of a semiconductor substrate 10 reduced in thickness by a process similar to the process described above. The support substrate 19Y is reduced in thickness by etching and the CMP method.

As shown in FIG. 14, a mask (resist mask) 17 is then formed on a support substrate 19Z by the photolithographic technique. The mask 17 has, in its part corresponding to the mounting position of the device, an opening that exposes the support substrate 19. An opening 69Z is formed in the support substrate 19Z at the mounting position of the device by the RIE method in accordance with the mask 17.

The mask 17 is removed, and then the device (device for forming the module) 60 used in the module is connected to the connection terminal 84 via the opening 69Z, as in the process shown in FIG. 12. The opening 69Z is encapsulated by an insulator (resin). In order to prevent a short circuit between the device 60 and the support substrate 19, a sidewall insulating film may be formed on the side surface of the support substrate 19Z in the inner surface of the support substrate 19Z in the opening 69Z before the device 60 is mounted.

The image sensor shown in FIG. 10 is formed by the process described above.

The color filter CF and the microlens array ML may be attached to the back surface of the semiconductor substrate 10 after the formation of the opening 69Z and the mounting of the device 60.

In the method of manufacturing the image sensor according to the third embodiment, the support substrate 19Y having no trench and no opening is attached, and an opening is then formed in the support substrate 19Y, as shown in FIG. 13. The device 60 is then mounted on insulating films 92 and 96 covering the front surface of the semiconductor substrate 10 via the opening 69Z formed after the attachment of the support substrate, as shown in FIG. 14. The device 60 is accommodated in the support substrate 19Z.

In this manufacturing method, the mounting area on the mounting substrate 200 and the size of the mounting substrate 200 can be reduced as in the first and second embodiments.

Consequently, according to the method of manufacturing the solid-state image sensing device of the third embodiment, it is possible to provide a solid-state image sensing device that contributes to the size reduction of the module.

In the image sensor according to each of the first to third embodiments, the device 60 for forming the camera module is stacked on insulating films 92 and 96 on the front surface of the semiconductor substrate 10. This allows the size reduction of the module. In addition, as compared with the case where the device 60 is formed in the semiconductor substrate 10, the increase in the chip size of the image sensor can be inhibited, the manufacture of the image sensor and the module including the same can be more efficient, and the manufacturing costs of the image sensor and the module including the same can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state image sensing device comprising:
    a semiconductor substrate chip which includes a first surface and a second surface opposite to the first surface;
    a pixel which is provided in the semiconductor substrate chip and which photoelectrically converts light emitted via a lens on the second surface;
    a support substrate which is provided on a first insulating layer covering an element on the first surface and which includes a trench;
    a first device which is stacked above the semiconductor substrate chip, which is provided on the first insulating layer and which is accommodated in the trench of the support substrate; and
    a solder bump which is provided on the first insulating layer and which contacts the first device and an interconnect in the first insulating layer and which connects the first device to the interconnect.

2. The solid-state image sensing device according to claim 1, further comprising:
    a second device provided on the first surface and an interconnect provided in the first insulating layer, wherein the first device is connected to the second device via the interconnect.

3. The solid-state image sensing device according to claim 1, wherein
    the first device is a passive element used in a module.

4. The solid-state image sensing device according to claim 1, wherein
    the first device is a semiconductor chip.

5. The solid-state image sensing device according to claim 1, further comprising:
    a sidewall insulating film provided on the side surface of the support substrate in the trench.

6. The solid-state image sensing device according to claim 1, wherein
    a second insulating layer covering the first device is provided in the trench.

7. The solid-state image sensing device according to claim 2, wherein
    the semiconductor substrate chip includes a pixel array including the pixel and a peripheral circuit for driving the pixel array,
    the second device is transistor included in at least one of the pixel array and the peripheral circuit.

8. A camera module comprising:
    the solid-state image sensing device according to claim 1,
    a processor which controls the operation of the solid-state image sensing device, and a lens unit which collects a light to the solid-state image sensing device.

9. A solid-state image sensing device manufacturing method comprising:
    forming a pixel in a semiconductor substrate;
    forming a first insulating layer on the first surface of the semiconductor substrate;
    stacking a first device on the first insulating layer;
    attaching, on the first insulating layer, a support substrate including a trench so that the first device is stacked above the semiconductor substrate and is accommodated in the trench; and
    forming a solder bump on the first insulating layer, which contacts the first device, and forming an interconnect in the first insulating layer, wherein the solder bump connects the first device to the interconnect.

10. The solid-state image sensing device manufacturing method according to claim 9, further comprising:
    forming a second device on the first surface before forming the first insulating layer.

11. The solid-state image sensing device manufacturing method according to claim 9, further comprising:
    forming a sidewall insulating film on the side surface of the trench before attaching the support substrate on the first insulating layer.

12. The solid-state image sensing device manufacturing method according to claim 9, further comprising:
    attaching a lens corresponding to the pixel to a second surface of the semiconductor substrate opposite to the first surface thereof.

13. The solid-state image sensing device manufacturing method according to claim 9, further comprising:
    forming, in the first insulating layer, an interconnect connected to a second device on the first surface;
    forming, in the first insulating layer, a contact portion which is connected to the interconnect and which includes an upper surface exposed through the first insulating layer; and
    disposing the first device on the upper surface of the contact portion and connecting the first device to the interconnect.

* * * * *